United States Patent
Gilton et al.

(10) Patent No.: US 6,713,355 B2
(45) Date of Patent: Mar. 30, 2004

(54) SEMICONDUCTOR PROCESSING METHOD

(75) Inventors: Terry Gilton, Boise, ID (US); David Korn, Boise, ID (US)

(73) Assignee: Micron Technology, Inc., Boise, ID (US)

(*) Notice: Subject to any disclaimer, the term of this patent is extended or adjusted under 35 U.S.C. 154(b) by 9 days.

(21) Appl. No.: 10/431,822

(22) Filed: May 8, 2003

(65) Prior Publication Data

US 2003/0203610 A1 Oct. 30, 2003

Related U.S. Application Data

(60) Continuation of application No. 09/480,072, filed on Jan. 10, 2000, now Pat. No. 6,576,939, which is a division of application No. 09/126,312, filed on Jul. 30, 1998, now Pat. No. 6,143,611.

(51) Int. Cl.$^7$ ............................................. H01L 21/336
(52) U.S. Cl. ..................... 438/279; 438/301; 438/303
(58) Field of Search ................................. 438/279, 301, 438/303, 625, 261

(56) References Cited

U.S. PATENT DOCUMENTS

| | | | |
|---|---|---|---|
| 4,599,118 A | 7/1986 | Han et al. | |
| 4,786,609 A | 11/1988 | Chen | |
| 4,954,867 A | 9/1990 | Hosaka | |
| 4,971,655 A | 11/1990 | Stefano et al. | |
| 4,981,810 A | 1/1991 | Fazan et al. | |

(List continued on next page.)

FOREIGN PATENT DOCUMENTS

| | | |
|---|---|---|
| JP | 58-25265 | 5/1983 |
| JP | 62-90974 | 9/1987 |
| JP | 64-73772 | 3/1989 |

OTHER PUBLICATIONS

Wolf et al., Silicon Processing for the VLSI Era, pp. 66–71 (1986).

Wolf et al., Silicon Processing for the VLSI Era, pp. 208 and 212 (1986).

Wolf et al., Silicon Processing for the VLSI Era, pp. 216–218 (1986).

Primary Examiner—John F. Niebling
Assistant Examiner—Walter L. Lindsay, Jr.
(74) Attorney, Agent, or Firm—Wells St. John P.S.

(57) ABSTRACT

In one implementation, first and second layers are formed over a substrate. One of the layers has a higher oxidation rate than the other when exposed to an oxidizing atmosphere. The layers respectively have an exposed outer edge spaced inside of the substrate periphery. Etching is conducted into the higher oxidation rate material at a faster rate than any etching which occurs into the lower oxidation rate material. Then, the substrate is exposed to the oxidizing atmosphere. In another implementation, a stack of at least two conductive layers for an electronic component is formed. The two conductive layers have different oxidation rates when exposed to an oxidizing atmosphere. The layer with the higher oxidation rate has an outer lateral edge which is recessed inwardly of a corresponding outer lateral edge of the layer with the lower oxidation rate. The stack is exposed to the oxidizing atmosphere effective to grow an oxide layer over the outer lateral edges of the first and second layers. In yet another implementation, a transistor comprises a semiconductive substrate and a gate stack formed thereover. The stack in at least one cross section defines a channel length within the substrate of less than 1 micron, with the stack comprising conductive material formed over a gate dielectric layer. An insulative layer is formed on outer lateral edges of the conductive material, with such layer having opposing substantially continuous straight linear outer lateral edges over all conductive material of the gate stack within the one cross section.

12 Claims, 3 Drawing Sheets

U.S. PATENT DOCUMENTS

| | | |
|---|---|---|
| 5,015,598 A | 5/1991 | Verhaar |
| 5,126,283 A | 6/1992 | Pintchovski |
| 5,219,777 A | 6/1993 | Kang |
| 5,262,352 A | 11/1993 | Woo et al. |
| 5,290,720 A | 3/1994 | Chen |
| 5,306,655 A | 4/1994 | Kurimoto |
| 5,306,951 A | 4/1994 | Lee et al. |
| 5,314,834 A | 5/1994 | Mazure et al. |
| 5,322,807 A | 6/1994 | Chen et al. |
| 5,334,556 A | 8/1994 | Guldi |
| 5,371,026 A | 12/1994 | Hayden |
| 5,382,533 A | 1/1995 | Ahmad et al. |
| 5,386,344 A | 1/1995 | Beaman et al. |
| 5,420,800 A | 5/1995 | Fukui |
| 5,430,313 A | 7/1995 | Kumagai et al. |
| 5,439,846 A | 8/1995 | Nguyen et al. |
| 5,476,802 A | 12/1995 | Yamazaki |
| 5,491,100 A | 2/1996 | Lee et al. |
| 5,512,771 A | 4/1996 | Hiroki et al. |
| 5,545,578 A | 8/1996 | Park et al. |
| 5,552,329 A | 9/1996 | Kim et al. |
| 5,552,332 A | 9/1996 | Tseng |
| 5,637,514 A | 6/1997 | Jeng |
| 5,668,028 A | 9/1997 | Bryant |
| 5,682,055 A | 10/1997 | Huang et al. |
| 5,714,413 A | 2/1998 | Brigham et al. |
| 5,739,066 A | 4/1998 | Pan |
| 5,759,901 A | 6/1998 | Loh et al. |
| 5,798,279 A | 8/1998 | Crisenza et al. |
| 5,897,353 A | 4/1999 | Kim et al. |
| 5,994,192 A | 11/1999 | Chen |
| 6,037,228 A | 3/2000 | Hsu |
| 6,040,241 A | 3/2000 | Lee et al. |
| 6,143,611 A * | 11/2000 | Gilton et al. ............... 438/279 |
| 6,365,497 B1 * | 4/2002 | Gonzalez ................... 438/593 |
| 6,372,618 B2 * | 4/2002 | Forbes et al. ............... 438/596 |

* cited by examiner

SEMICONDUCTOR PROCESSING METHOD

RELATED PATENT DATA

This patent resulted from a continuation application of U.S. patent application Ser. No. 09/480,072, filed Jan. 10, 2000 now U.S. Pat. No. 6,576,939, entitled "Semiconductor Processing Methods, Methods of Forming Electronic Components, and Transistors", naming Terry L. Gilton and David Korn as inventors, the disclosure of which is incorporated by reference; which patent resulted from a divisional application of U.S. patent application Ser. No. 09/126,312, filed Jul. 30, 1998, entitled "Semiconductor Processing Methods, Methods of Forming Electronic Components, and Transistors" naming Terry L. Gilton and David Korn as inventors, now U.S. Pat. No. 6,143,611, the disclosure of which is incorporated by reference.

TECHNICAL FIELD

This invention relates to semiconductor processing methods, including methods of fabricating electronic components such as transistors.

BACKGROUND OF THE INVENTION

Field effect transistors are comprised of a pair of diffusion regions, referred to as a source and a drain, spaced apart within a semiconductive substrate. The transistors include a gate provided adjacent a substrate separation region between the diffusion regions for imparting an electric field to enable current to flow between the diffusion regions. The substrate material adjacent the gate and between the diffusion regions is referred to as the channel.

The semiconductive substrate typically comprises bulk crystalline silicon having a light conductivity doping impurity concentration of opposite type to the predominate doping of the source and drain regions. Alternately, the substrate can be provided in the form of a thin layer of lightly doped semiconductive material over an underlaying insulating layer. Such are commonly referred to as semiconductor-on-insulator (SOI) constructions. In the context of this document, the term "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Integrated circuitry fabrication technology continues to strive to increase circuit density, and thereby minimize the size and channel lengths of field effect transistors. Improvements in technology have resulted in reduction of field effect transistor size from long-channel devices (i.e., channel lengths greater than two microns), to short-channel devices (i.e., channel lengths less than two microns), and to sub-micron devices (i.e., channel lengths less than one micron). As field effect transistor channel lengths (i.e., gate or word line widths) became smaller than two microns, so-called short-channel effects began to become increasingly significant. As a result, device design and consequently process technology had to be modified to take these effects into account so that optimum device performance could continue to be obtained. For example, the lateral electrical field in the channel region increases as a result of smaller transistor channel lengths as the supply voltage remains constant. If the field becomes strong enough, it can give rise to so-called hot-carrier effects. Hot-carrier effects often lead to gate oxide degradation, as energetic carriers can be injected into gate oxide and become permanent charges.

Two recognized solutions to this problem, used either alone or in combination, include source/drain re-oxidation and provision of lightly doped drain (LDD) regions. Source/drain re-oxidation effectively grows a layer of thermal oxide over the source and drain areas as well as over the gate sidewalls. The oxidation has the effect of rounding the poly gate edge corners in effectively oxidizing a portion of the gate and underlying substrate, thereby increasing the thickness of the gate oxide layer at least at the edges of the gate. Such reduces the gate-to-drain overlap capacitance, and strengthens the gate oxide of the polysilicon gate edge. The latter benefits are effectively obtained because oxidation-induced encroachment gives rise to a graded gate oxide under the polysilicon edge. The thicker oxide at the gate edge relieves the electric-field intensity at the corner of the gate structure, thus reducing short-channel effects.

An example technique for accomplishing such re-oxidation includes conventional wet and dry oxidations at atmospheric pressure and at a temperature of 800° C. or greater. Typical process exposure time is 10 minutes, which also grows a layer of oxide from 50 to 200 Angstroms thick on the sidewalls of the patterned gate.

LDD regions are provided within the substrate relative to the channel region in advance of the source and drains, and further reduce hot-carrier effects. The LDD regions are provided to be lighter conductively doped (i.e., less concentration) than the source and drain regions. This facilitates sharing the voltage drop between the drain and the channel, as opposed to the stark voltage drop at the channel occurring in non-LDD transistors. The LDD regions absorb some of the voltage drop potential into the drain, thus effectively eliminating hot-carrier effects. As a result, the stability of the device is increased.

Most commonly, a combination of source/drain re-oxidation and formation of LDD regions is utilized. However in combination, these processes can create problems, particularly in fabrication of sub-micron devices.

For example, consider FIGS. 1–2. FIG. 1 depicts a semiconductor wafer fragment 10 comprised of a bulk monocrystalline substrate 12 having a gate structure 14 formed thereover. Gate 14 comprises a gate oxide layer 16, an overlying conductively doped polysilicon layer 18, an overlying refractory metal silicide layer 20, and an insulative cap 22, such as $Si_3N_4$. That region beneath gate oxide layer 16 within bulk substrate 12 will constitute the channel region of the resultant transistor. Unfortunately when subjected to source/drain re-oxidation, the differing materials of gate 14 do not oxidize at the same rate. FIG. 2 illustrates an oxide layer 24 formed over substrate 12 and the sidewalls of gate structure 14 after a source/drain re-oxidation. Silicide layer 20 of gate structure 14 has a tendency to oxidize at a significantly greater rate than the oxidation of either nitride layer 22 or polysilicon layer 18. Such results in the formation of the illustrated sidewall bulges 25.

The typical manner by which LDD regions are fabricated is by ion implantation of conductivity dopant impurity after source/drain re-oxidation, such as regions 26. Unfortunately, oxide bulges 25 in layer 24 effectively function as a mask to such ion implantation. This results in formation of LDD implant regions 26 being laterally spaced outwardly away from the original sidewalls of gate structure 14. This is undesirable. More preferably, the inner lateral edges of LDD regions 26 are desirably as close to the gate edges as possible.

The invention was principally motivated in overcoming drawbacks such as that described above with respect to field effective transistors fabrication. The artisan will, however, appreciate applicability of the following invention to other aspects of semiconductor wafer processing in formation of other electronic components or devices, with the invention only being limited by the accompanying claims appropriately interpreted in accordance with the Doctrine of Equivalents.

SUMMARY OF THE INVENTION

The invention comprises semiconductor processing methods, methods of forming electronic components, and transistors. In one implementation, first and second layers are formed over a substrate. One of the layers has a higher oxidation rate than the other when exposed to an oxidizing atmosphere. The substrate has a periphery. The layers, respectively, have an exposed outer edge spaced inside the substrate periphery. Etching is conducted into the higher oxidation rate material at a faster rate than any etching which occurs into the lower oxidation rate material. After the etching, the substrate is exposed to the oxidizing atmosphere.

In but one other implementation, a stack of at least two conductive layers for an electronic component is formed over a substrate. The two conductive layers have different oxidation rates when exposed to an oxidizing atmosphere. The layer with the higher oxidation rate has an outer lateral edge which is recessed inwardly of a corresponding outer lateral edge of the layer with the lower oxidation rate. The stack of conductive layers is exposed to the oxidizing atmosphere effective to grow an oxide layer over the outer lateral edges of the first and second layers.

In but one other implementation, a transistor comprises a semiconductive substrate and a gate stack formed thereover. The gate stack in at least one cross section defines a channel length within the semiconductive substrate of less than 1 micron, with the gate stack comprising conductive material formed over a gate dielectric layer. An insulative layer is formed on outer lateral edges of the conductive material, with the insulative layer having opposing substantially continuous straight linear outer lateral edges over all conductive material of the gate stack within the one cross section.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 3:
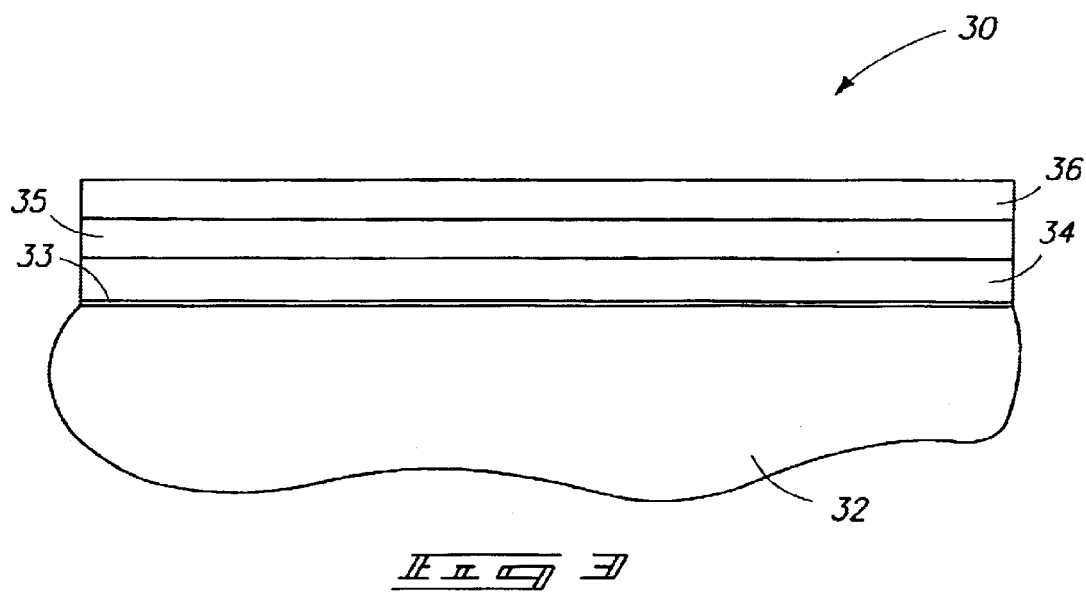
FIG. 3 is a diagrammatic sectional view of a semiconductor wafer fragment at one processing step in accordance with the invention.

Referring initially to FIG. 3, a semiconductor wafer fragment 30 comprises a bulk monocrystalline silicon substrate 32. A gate dielectric layer 33 (i.e., $SiO_2$), a conductively doped silicon layer 34 (i.e., polysilicon), a silicide layer 35 (i.e., a refractory metal silicide, such as $WSi_x$) and an insulating layer 36 (i.e., doped or undoped $SiO_2$, $Si_3N_4$, etc.) are formed over monocrystalline substrate 32. Silicide layer 35 has a higher oxidation rate than oxidation rates of layers 34 and 36 when exposed to an oxidizing atmosphere, with an example oxidizing atmosphere being oxygen gas at a temperature of about 950° C.

Figure 4:
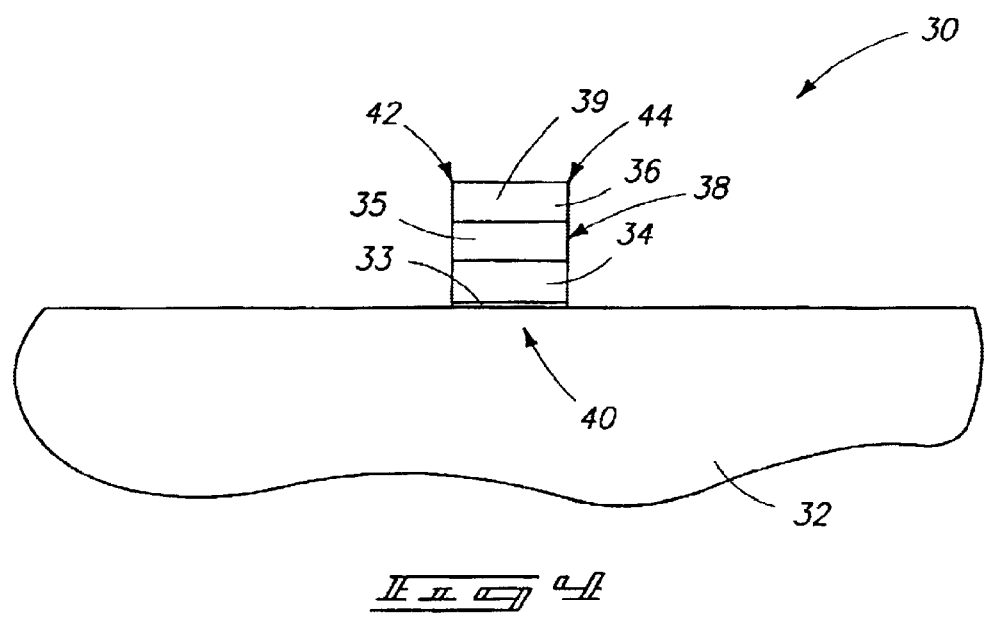
FIG. 4 is a view of the FIG. 3 wafer fragment at a processing step subsequent to that shown by FIG. 3.

Referring to FIG. 4, insulating layer 36, silicide layer 35, doped silicon layer 34, and gate dielectric layer 33 are patterned and etched (i.e., by photolithography) to form a conductive gate stack 38 (having an insulating cap 39) over a channel region 40 of substrate 32. The preferred technique for forming the illustrated stack is by dry etching, for example, using chemistries comprising $CH_4/CHF_3$ for the insulative cap, $NF_3/Cl_2$ for the silicide, and $Cl_2/HBr$ for the polysilicon. Gate stack 38 comprises two opposing and respectively linearly aligned outer lateral edges 42 and 44 of the insulating silicide and doped silicon layers. Accordingly or alternately considered, layers 34 and 35 constitute first and second layers (both being conductive in this example) formed over a substrate, with the second layer being formed over the first and having a higher oxidation rate than the first when exposed to a certain oxidizing atmosphere. Although layer 35 is shown received over layer 34, the relationship might be reversed depending on the processor's desire and the component being fabricated. The first and second conductive materials in this example have been etched to form a conductive component, here in the form of a transistor gate 38. The substrate has a periphery (outside of the cross-sectional views of FIGS. 3–7), with first layer 34 having an exposed first outer edge (i.e., so either edge 42 or 44) spaced inside the substrate periphery, and with second layer 35 having an exposed first outer edge (i.e., either edge 42 or 44) spaced inside the substrate periphery.

Layer 36 (cap 39) comprises a third layer formed over the first and second layers, with itself having an exposed outer edge (i.e., either edge 42 or 44) spaced inside the substrate periphery. Third layer 36 has a lower oxidation rate than the oxidation rate of second layer 35 when exposed to the oxidizing atmosphere. The invention is believed to have its greatest applicability to electronic component device fabrication having widths less than 1 micron. Accordingly, the etching(s) to produce the FIG. 4 construction is ideally conducted to space opposing linear outer lateral edges 42 and 44 less than 1 micron apart from one another. Accordingly in the illustrated preferred embodiment where a transistor is being fabricated in the preferred sub-micron fabrication, the illustrated first conductive layer 34 is at least fabricated to have its opposing outer lateral edges spaced less than 1 micron apart. Such defines, in the illustrated cross-section, a channel length (i.e., minimum gate width) within channel region 40 of semiconductive substrate 32 of less than 1 micron.

Figure 5:
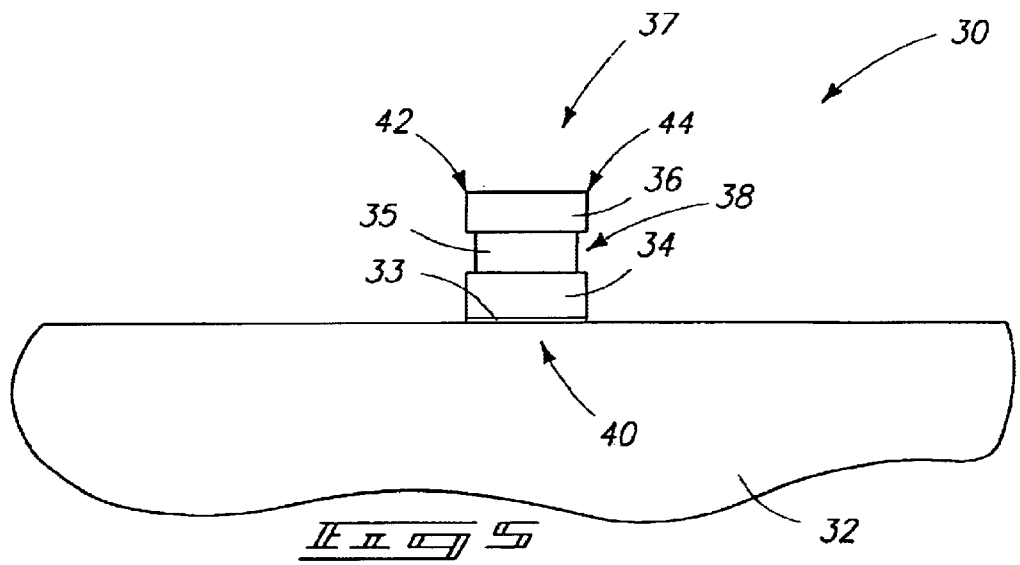
FIG. 5 is a view of the FIG. 3 wafer fragment at a processing step subsequent to that shown by FIG. 4.

Referring to FIG. 5, silicide layer 35 is etched at a faster rate than any etching into edges 42 and 44 of layers 36 and 34 to recess outer lateral edges of silicide layer 35 to within outer lateral edges of both layers 36 and 34 of the illustrated stack. Such produces conductive layers 34 and 35 within the illustrated cross-section to have respective opposing outer lateral edges which are displaced from one another. Accordingly, the outer lateral edge of the layer with the higher oxidation rate is recessed inwardly of corresponding outer lateral edges of the layers with lower oxidation rate in the particular oxidizing atmosphere.

The preferred etching is a wet etching, preferably with a basic solution. An example is a solution comprising ammonium hydroxide and hydrogen peroxide, with a specific example solution being ammonium hydroxide, $H_2O_2$, and $H_2O$ in a mix of 0.25:1:5 by volume. Example conditions for such etching include ambient pressure, a temperature ranging from 40° C. to 70° C. for from 1 to 10 minutes. Alternate bases (i.e., KOH) could be used in addition to or instead of ammonium hydroxide in the preferred basic wet etching. Such example chemistries can provide substantially selective etching of layer 35 relative to the etching of layers 36, 34, and substrate 32 if it is exposed. In the context of this document, "substantially selective" is to be interpreted to mean an etch rate of one material relative to another of at least 2:1.

Figure 1:
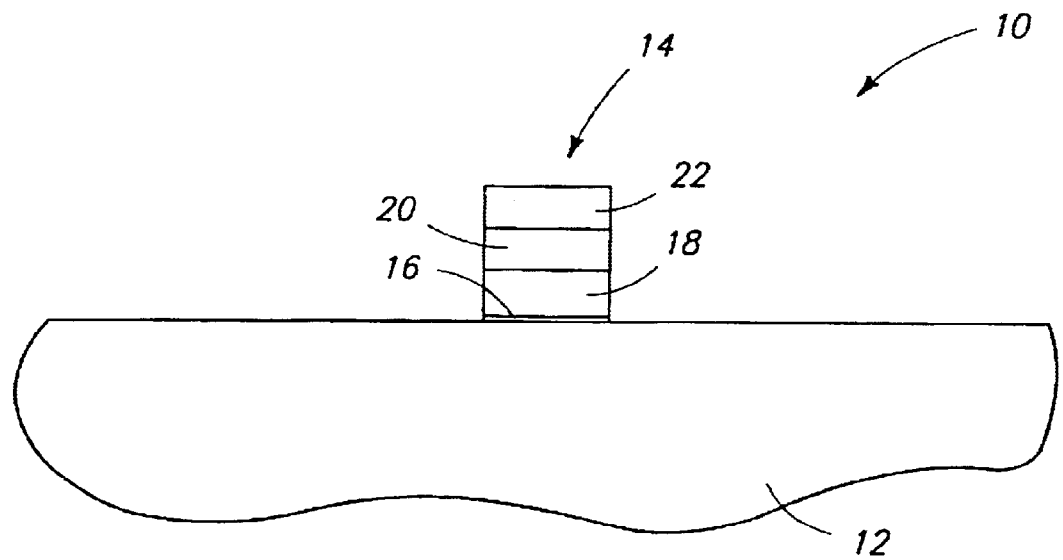
FIG. 1 is a diagrammatic sectional view of a prior art semiconductor wafer fragment at a prior art processing step, and is described in the "Background" section above.
Figure 2:
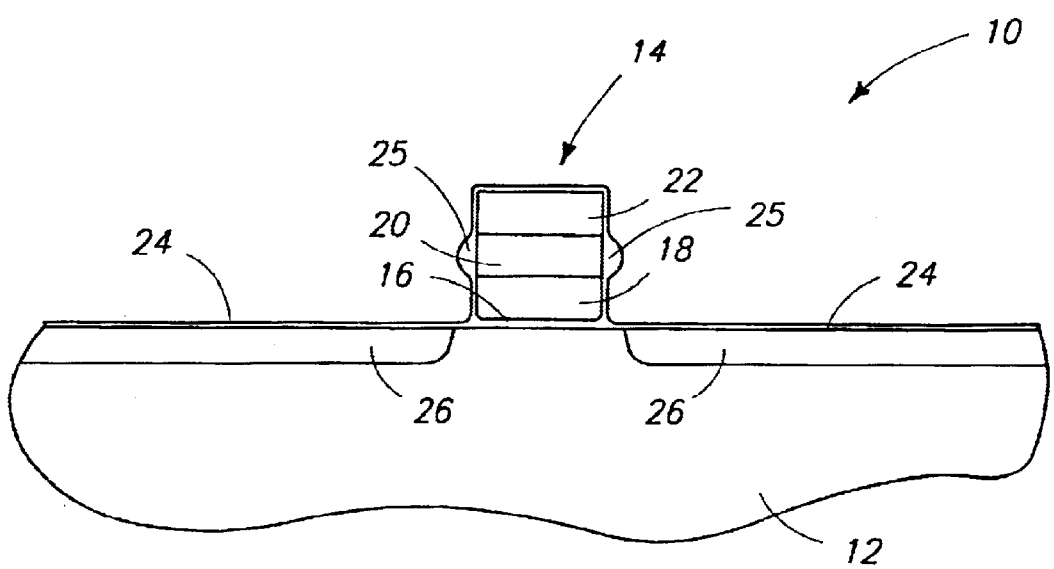
FIG. 2 is a view of the FIG. 1 wafer fragment at a prior art processing step subsequent to that show by FIG. 1.
Figure 6:
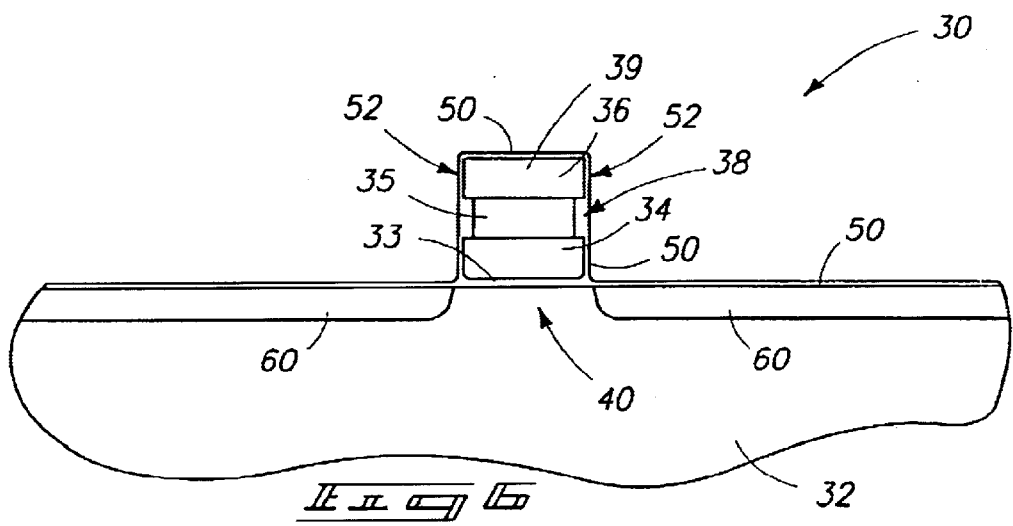
FIG. 6 is a view of the FIG. 3 wafer fragment at a processing step subsequent to that shown by FIG. 5.

Referring to FIG. 6, the substrate is exposed to the oxidizing atmosphere with a recessed edge of second layer 35 being exposed. In the preferred embodiment, this is conducted to be effective to grow an oxide layer 50 over outer lateral edges of silicide layer 35 and doped silicon layer 34. Such is also effective to form oxide layer 50 over silicon substrate 32 and even, to perhaps a lesser degree, over insulating cap 39. Thus, a recessed edge of layer 35 is oxidized. Preferably, layer 50 is formed to produce oxide layer 50 to have opposing substantially continuous straight linear outer lateral edges 52 at least over first and second conductive materials 35 and 34 (i.e., over all conductive material of the gate stack within at least the one illustrated cross-section). Regardless and ideally, the prior art FIG. 2 outward lateral bulges 25 do not occur. Oxide layer 50 ideally has a lateral thickness of less than 100 Angstroms and greater than 10 Angstroms over first conductive material 34. Further ideally in the application of the invention to ever increasingly sub-micron devices, opposing linear outer lateral edges 52 of oxide layer 50 are formed to be less than 1 micron in separated distance. Alternate insulating material layers 50 could also of course be utilized.

After the preferred oxidizing to form oxide layer 50, a suitable dopant impurity is ion implanted into substrate 32 proximate gate stack 38 to form one or more LDD regions, or halo regions, 60. Effective removal or prevention of formation of lateral bulges 25 of the FIG. 2 prior art can accordingly be utilized to position regions 60 more proximate the outer lateral edges of the gate stack, particularly in fabrication of sub-micron devices.

Figure 7:
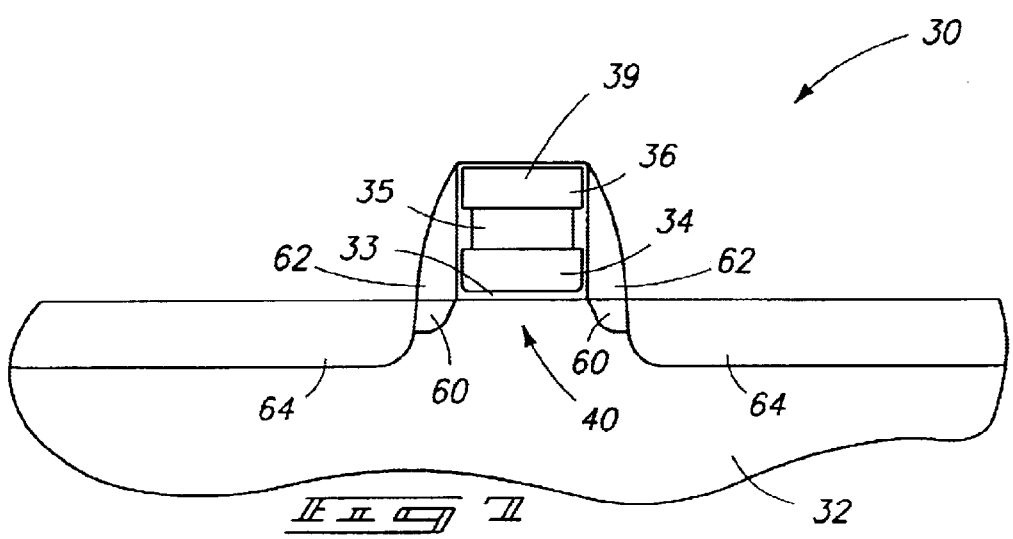
FIG. 7 is a view of the FIG. 3 wafer fragment at a processing step subsequent to that shown by FIG. 6.

Referring to FIG. 7, insulative material is formed over oxide layer 50 and is subsequently anisotropically etched to produce insulative illustrated spacers 62. Subsequent ion implanting can then be conducted to provide dopant impurity into substrate 32 proximate the gate stack to form field effect transistor source/drain regions 64.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A semiconductor processing method comprising:

forming a stack of at least first and second conductive layers for an electronic component over a substrate, the first and second conductive layers having different oxidation rates when exposed to a thermal oxidizing atmosphere, the layer with the higher oxidation rate having an outer lateral edge which is recessed laterally inward of a corresponding outer lateral edge of the layer with the lower oxidation rate; and exposing the stack of conductive layers to the thermal oxidizing atmosphere effective to grow an oxide layer over the outer lateral edges of the first and second layers, the oxide layer having a substantially continuous straight linear outer lateral edge portion extending over the first and second conductive layers.

2. The method of claim 1 comprising forming the higher oxidation rate layer over the lower oxidation rate layer.

3. The method of claim 1 comprising forming the lower oxidation rate layer over the higher oxidation rate layer.

4. The method of claim 1 comprising forming another layer over the at least first and second conductive layers, the another layer having a lower oxidation rate than the layer having said higher oxidation rate when exposed to the oxidizing atmosphere, the outer lateral edge of the layer with said higher oxidation rate being recessed inwardly of a corresponding outer lateral edge of the another layer.

5. The method of claim 4 wherein the another layer is electrically insulative.

6. The method of claim 1 wherein one of the at least first and second conductive layers comprises conductively doped polysilicon and another of the at least first and second conductive layers comprises a refractory metal silicide.

7. The method of claim 1 wherein the layer with the higher oxidation rate has an opposing pair of outer lateral edges which are recessed laterally inward of a corresponding pair of opposing outer lateral edge of the layer with the lower oxidation rate, the exposing being effective to grow an oxide layer over each of the outer lateral edges of the pair of outer lateral edges of the first and second layers, each of the oxide layers having a respective substantially continuous straight linear outer lateral edge portion extending over the first and second conductive layers.

8. The method of claim 1 further comprising ion implanting into the substrate proximate the substantially continuous straight linear outer lateral edge of the oxide layer after the exposing.

9. The method of claim 1 further comprising forming an insulative layer over the oxide layer and thereafter anisotropically etching the insulative layer to form an insulative spacer over the oxide layer.

10. The method of claim 1 further comprising fabricating the stack as at least part of a gate of a field effect transistor.

11. The method of claim 1 wherein the outer lateral edges of the first and second conductive layers are each straight linear prior to the exposing.

12. The method of claim 1 wherein the portion extends over substantially all at the outer lateral edges of the first and second conductive layers.

* * * * *

UNITED STATES PATENT AND TRADEMARK OFFICE
CERTIFICATE OF CORRECTION

PATENT NO. : 6,713,355 B2
DATED : March 30, 2004
INVENTOR(S) : Terry I. Gilton et al.

It is certified that error appears in the above-identified patent and that said Letters Patent is hereby corrected as shown below:

Title page,
Item [56], References Cited, U.S. PATENT DOCUMENTS, delete "5,386,344 A 1/1995 Beaman et al." insert -- 5,286,344 A 2/1994 Blalock et al. --

Column 4,
Line 34, replace "exposed first outer edge (i.e., so either edge 42 or 44) spaced" with -- exposed first outer edge (i.e., either edge 42 or 44) spaced --

Column 6,
Line 59, replace "over substantially all at the outer lateral edges of the first and" with -- over substantially all of the outer lateral edges of the first and --

Signed and Sealed this

Twenty-third Day of November, 2004

JON W. DUDAS
*Director of the United States Patent and Trademark Office*